US011943901B1

(12) United States Patent
Adams (10) Patent No.: US 11,943,901 B1
(45) Date of Patent: Mar. 26, 2024

(54) CONTAINER-BASED DATA CENTER

(71) Applicant: Core Scientific, Inc., Bellevue, WA (US)

(72) Inventor: Weston Adams, Las Vegas, NV (US)

(73) Assignee: Core Scientific Operating Company, Bellevue, WA (US)

( * ) Notice: Subject to any disclaimer, the term of this patent is extended or adjusted under 35 U.S.C. 154(b) by 685 days.

(21) Appl. No.: 17/081,393

(22) Filed: Oct. 27, 2020

Related U.S. Application Data

(60) Provisional application No. 62/972,648, filed on Feb. 11, 2020.

(51) Int. Cl.
*H05K 7/20* (2006.01)
*B01D 39/10* (2006.01)
*E04H 5/02* (2006.01)
*E04H 1/12* (2006.01)
*E04H 5/00* (2006.01)

(52) U.S. Cl.
CPC ......... *H05K 7/20736* (2013.01); *B01D 39/10* (2013.01); *E04H 5/02* (2013.01); *E04H 2001/1283* (2013.01); *E04H 2005/005* (2013.01)

(58) Field of Classification Search
CPC .................................................. H05K 7/20736
See application file for complete search history.

(56) References Cited

U.S. PATENT DOCUMENTS

| 10,178,794 | B1* | 1/2019 | Bailey | H02G 3/38 |
| 2010/0015904 | A1* | 1/2010 | Yeh | B01D 46/0005 55/511 |
| 2016/0105994 | A1* | 4/2016 | Hwang | H05K 7/20745 361/695 |
| 2016/0288991 | A1* | 10/2016 | Richardson | G06F 1/16 |
| 2021/0318735 | A1* | 10/2021 | Barbour | G06F 1/20 |

* cited by examiner

Primary Examiner — Mukundbhai G Patel
(74) Attorney, Agent, or Firm — Fishman Stewart PLLC (57) ABSTRACT

A system for operating and cooling a plurality of computing devices in a container-based data center is disclosed. Shipping containers are configured with air intake openings having triangular prism or trapezoidal prism shaped vents. The vents hold filters that can remove dust, debris, and moisture droplets from the incoming air. Fans draw fresh air into the container through the filters and direct the filtered air across the computing devices to cool them. The heated air is then expelled out of the container via exhaust openings on the opposite side of the container from the air intake openings.

20 Claims, 8 Drawing Sheets

CONTAINER-BASED DATA CENTER

CROSS-REFERENCE TO RELATED APPLICATIONS

This application claims priority to U.S. Provisional Patent Application Ser. No. 62/972,648, filed on Feb. 11, 2020, and titled "CONTAINER-BASED DATA CENTER", the contents of which are hereby incorporated by reference in their entirety.

TECHNICAL FIELD

The present disclosure generally relates to the field of computing and, more particularly, to systems for operating large numbers of computing devices in a data center.

BACKGROUND

This background description is set forth below for the purpose of providing context only. Therefore, any aspect of this background description, to the extent that it does not otherwise qualify as prior art, is neither expressly nor impliedly admitted as prior art against the instant disclosure.

Many cryptocurrencies (e.g., Bitcoin, Litecoin) are based on a technology called blockchain, in which transactions are combined into blocks. These blocks are stored with previous blocks of earlier transactions into a ledger (the "blockchain") and rendered immutable (i.e., practically unmodifiable) by including a hash. The hash is a number that is calculated based on the blocks and that meets the blockchain's particular criteria. Once the block and hash are confirmed by the cryptocurrency network, they are added to the blockchain. The hashes can be used to verify whether any of the prior transactions or blocks on the blockchain have been changed or tampered with. This creates an immutable ledger of transactions and allows the cryptocurrency network to guard against someone trying to double spend a digital coin.

Many cryptocurrency networks consist of a large number of participants that repeatedly attempt to be the first to calculate a hash meeting the blockchain network's requirements. They receive a reward (e.g., a coin reward or transaction fee reward) that motivates them to continue participating (mining).

Many blockchain networks require computationally difficult problems to be solved as part of the hash calculation. The difficult problem requires a solution that is a piece of data which is difficult (costly, time-consuming) to produce, but is easy for others to verify and which satisfies certain requirements. This is often called "proof of work". A proof of work (PoW) system (or protocol, or function) is a consensus mechanism. It deters denial of service attacks and other service abuses such as spam on a network by requiring some work from the service requester, usually meaning processing time by a computer.

Participants in the network operate standard PCs, servers, or specialized computing devices called mining rigs or miners. Because of the difficulty involved and the amount of computation required, these computing devices are often configured with specialized components that improve the speed at which hashes or other calculations required for the blockchain network are performed. Examples of specialized components include application specific integrated circuits (ASICs), field programmable gate arrays (FPGAs), graphics processing units (GPUs) and accelerated processing unit (APUs).

Miners are often run for long periods of time at high frequencies that generate large amounts of heat. Even with cooling (e.g., high speed fans), the heat and constant operation can negatively impact the reliability and longevity of the components in the miners. ASIC miners for example have large numbers of hashing chips (e.g., 100's) that are more likely to malfunction as temperatures rise.

Many participants in blockchain networks operate large numbers (e.g., 100's, 1000's or more) of different miners (e.g., different generations of miners from one manufacturer or different manufacturers) concurrently in large data centers. These data centers can be costly and time consuming to construct and operate. Costs such as building materials and labor for constructing data center buildings can be prohibitive. In addition, obtaining building permits and inspections prior to completion can cause significant delays.

Figure 1:
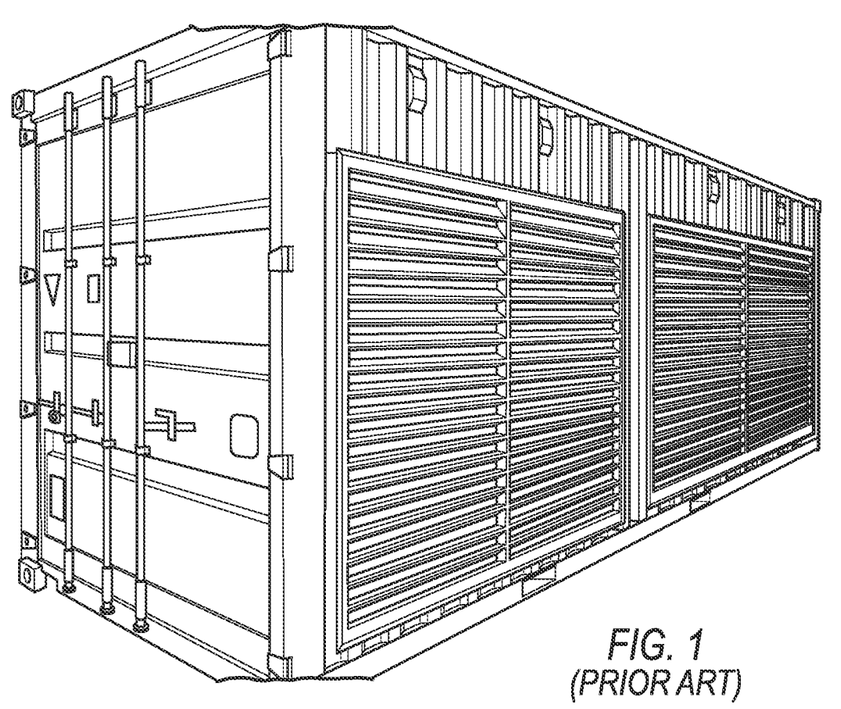
FIG. 1 is an example of a prior art container with louvers.

One solution that has been proposed to address these problems is using shipping containers to house computing devices. Shipping containers are cheap and readily available, and many countries receive a steady surplus of these metal boxes as goods are imported. While these solutions address the concerns of material costs and permit times, they have other significant drawbacks. Prior shipping container solutions typically involve external active cooling units (e.g., air conditioning units) or cutting large openings in the sides of containers covered with louvers or slats that allow air to flow through the container while keeping some of the rain out. FIG. 1 illustrates one such prior solution using louvers. Solutions with external cooling units use significantly more power than air-cooling along. And solutions with louvers can allow significant dust, debris, and moisture into the container causing reliability problems for the computing devices. For at least these reasons, an improved system for operating computing devices in a container-based data center is desired.

SUMMARY

A system for operating a plurality of computing devices in a container-based data center is contemplated. In one embodiment, the system comprises a shipping container having one or more ventilation openings cut into each of the container's two long sides and an array of triangular prism air intake vents affixed to the one or more openings. One rectangular side of each triangular prism vent is formed by a rectangular air filter. The container includes racks for holding a plurality of computing devices in close proximity to a second of the two largest sides opposite the first side with the air intake vents. In some embodiments the system may include an array of triangular prism exhaust vents affixed to a second of the two largest sides of the shipping container, and exhaust from computing devices on the racks is directed out the exhaust vents. The system may include a plurality of computing devices with cooling fans, wherein each computing device is mounted on one of the racks and exhausts air through openings in the side of the shipping container.

In some embodiments, a channel may be connected to a bottom edge of the rectangular air filter, wherein the channel is configured to catch moisture collected by the air filter. The air filters may be washable metallic mesh with a metal frame and one or more drain holes. In some embodiments, the filters may also function as mist eliminators to remove moisture droplets from the air entering the container, and the vents may include a channel connected to a bottom edge of the air filter to catch moisture collected by the air filter. Each triangular prism vent may also comprise a pair of parallel channels configured to hold the air filter or filters.

In some embodiments, the vents may be in a one- or two-dimensional array and may cover a substantial portion of at least one side of the container (e.g., at least 90% of one of the largest sides). The shipping container may be a standard ISO steel intermodal container or other configuration (e.g., custom dimensions). The vents (e.g., in the top row of the array) may have a top that extends horizontally beyond the edge of the filter. The combined surface area of the filters may be significantly larger than the surface area of the plurality of openings on the largest sides of the shipping container. In some embodiments, the vents may be isosceles right triangular prisms, trapezoidal prism, rectangular prisms, or other shapes.

In one embodiment, the system for operating a plurality of computing devices comprises: a shipping container having a substantially rectangular prism shape and at least one air intake opening on at least a first side and at least one air exhaust opening on at least a second side, wherein the first side and the second side are on opposite sides of the shipping container; an array of air intake vents affixed to the at least one air intake opening, wherein at least one of the intake vents comprises at least one air filter, wherein the at least one air filter is substantially larger than the corresponding air intake opening and is not parallel to the corresponding air intake opening; and a plurality of racks adjacent to the at least one air exhaust opening; a plurality of computing devices positioned on the plurality of racks; and at least one fan operable to cool the plurality of computing devices by drawing fresh air in through the at least one air filter and to force air within the shipping container out the at least one air exhaust opening.

The foregoing and other aspects, features, details, utilities, and/or advantages of embodiments of the present disclosure will be apparent from reading the following description, and from reviewing the accompanying drawings.

DETAILED DESCRIPTION

Reference will now be made in detail to embodiments of the present disclosure, examples of which are described herein and illustrated in the accompanying drawings. While the present disclosure will be described in conjunction with embodiments and/or examples, it will be understood that they do not limit the present disclosure to these embodiments and/or examples. On the contrary, the present disclosure covers alternatives, modifications, and equivalents.

Various embodiments are described herein for various apparatuses, systems, and/or methods. Numerous specific details are set forth to provide a thorough understanding of the overall structure, function, manufacture, and use of the embodiments as described in the specification and illustrated in the accompanying drawings. It will be understood by those skilled in the art, however, that the embodiments may be practiced without such specific details. In other instances, well-known operations, components, and elements have not been described in detail so as not to obscure the embodiments described in the specification. Those of ordinary skill in the art will understand that the embodiments described and illustrated herein are non-limiting examples, and thus it can be appreciated that the specific structural and functional details disclosed herein may be representative and do not necessarily limit the scope of the embodiments.

Computing devices in data centers are often organized into pods. Pods are standardized blocks of racks, either in a row or pair of rows, that share some common infrastructure elements like power distribution units, and network routers/switches. Within a pod, the devices on the racks may all be oriented to pull cool air in from the same side of the rack (typically referred to as the front of the rack) and discharge hot air (heated by the computing devices) out the other side of the rack (typically referred to as the back or hot side of the rack).

Figure 2:
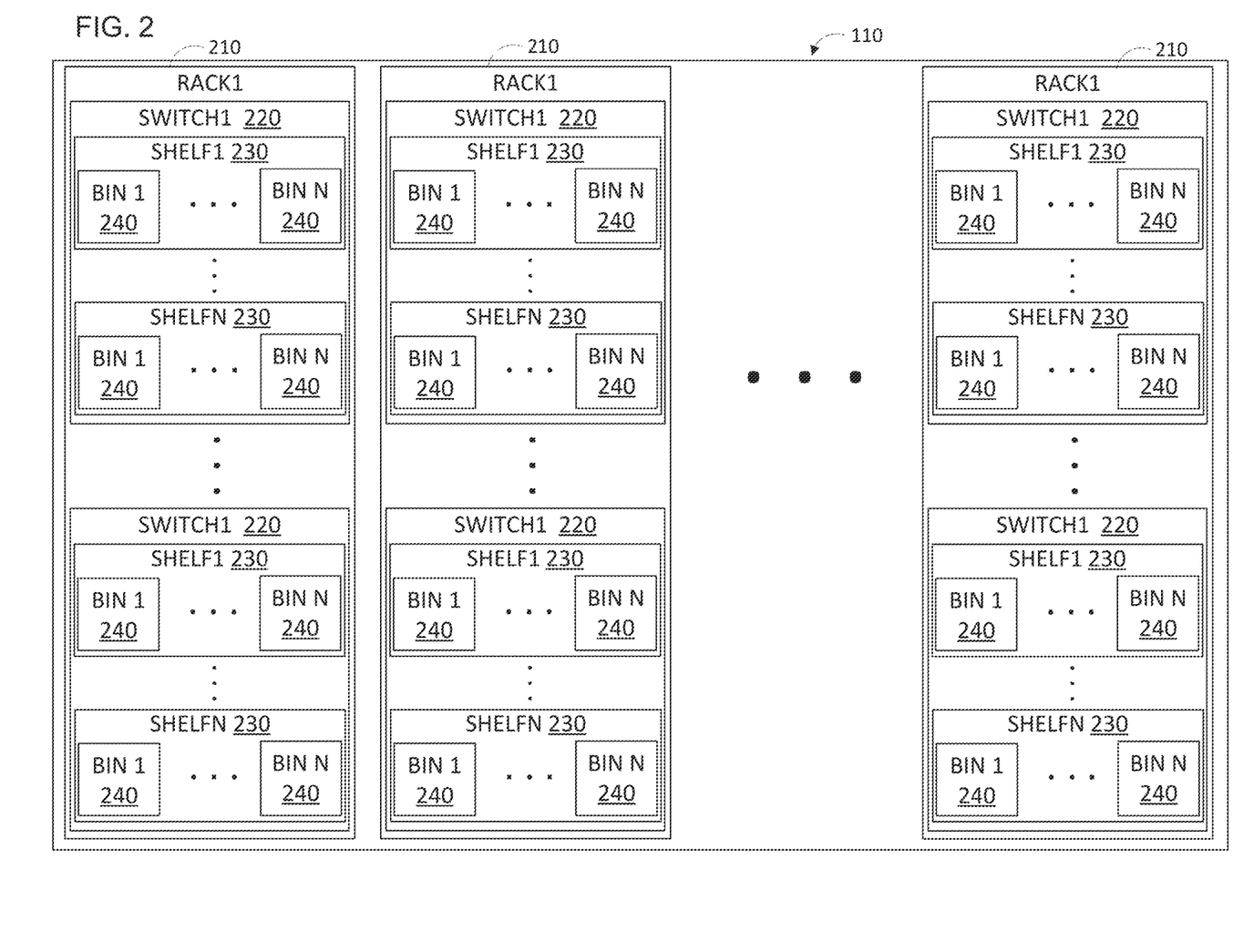
FIG. 2 is a front view of one example of a pod in a data center for computing devices.

Turning now to FIG. 2, the front side of one example of a pod 110 is shown. The pod 110 has a number of racks 210 that each have a number of shelves 230 for holding computing devices. For organization and management purposes, the shelves may be grouped together in switch sections 220 that are each supported by the same network switch. In each of the shelves 230 there may be multiple bin locations 240 that each hold a single computing device. Each computing device may be installed in a bin with connections for power and a network connection.

Figure 3:
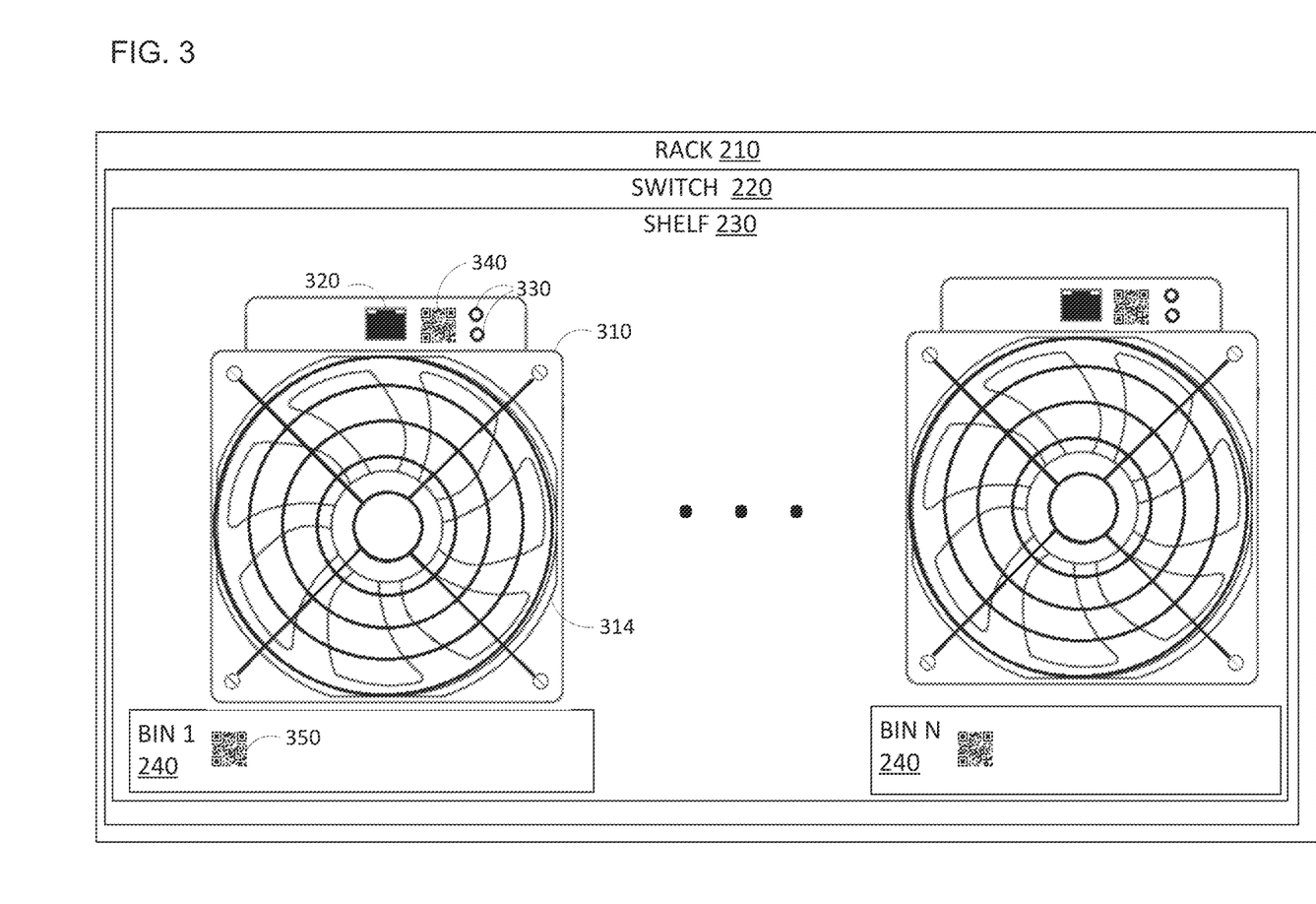
FIG. 3 is an illustration of one example of a portion of a rack for computing devices in a data center.

Turning now to FIG. 3, a more detailed frontal view of one shelf 230 in an example rack 210 is shown. In this example, a computing device 310 is installed in each bin 240 in the shelf 230. In this example, computing device 310 is an ASIC miner, but other computing device types are possible and contemplated. ASIC miners typically include one or more cooling fans 314 that draw air through the center of the miner where there are multiple hash boards performing calculations and generating heat. Other types of computing devices are possible and contemplated, including GPU and FPGA miners, as well as more traditional computer servers.

As shown in the figure, devices and bins may be identified by stickers 340 and 350, respectively. These stickers may include visual indicators such as printed serial numbers, asset tag numbers, and or barcodes or QR codes. The devices also have one or more indicator lights (typically LEDs) 330 that are visible from the front side of the device, and many such devices provide an interface accessible via network connection that permits a system administrator to activate/deactivate the lights.

Figure 4:
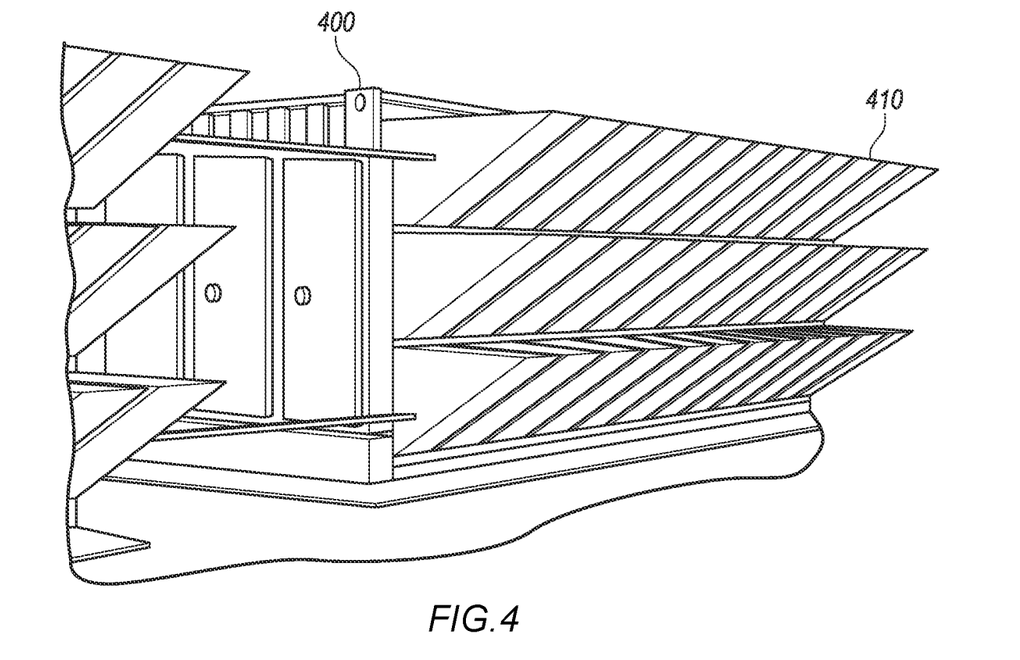
FIG. 4 is a perspective view of one example of a container-based data center.

Turning now to FIG. 4, a perspective view of one example of a container-based data center in accordance with the present disclosure is shown. In this embodiment, container 400 is an ISO steel shipping container and has a plurality of triangular prism or trapezoidal prism shaped vents 410 on at least one side. The containers may be manufactured for example according to ISO standard 668, which defines a set of specifications for intermodal freight shipping containers that are commonly available. Standard containers are 8'6" tall and so called High-Cube containers are 9'6" tall, but they are both generally 8 feet wide. Other types of containers are also contemplated and may be used as well.

Figure 5:
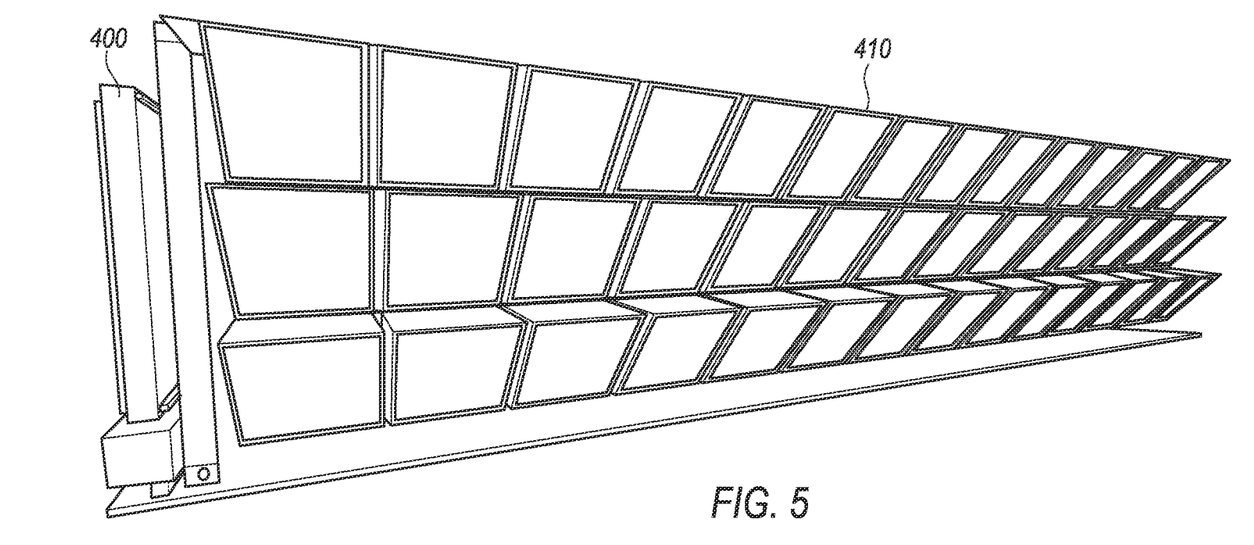
FIG. 5 is a side view of one example of a container-based data center.

Turning now to FIG. 5, a side view of one example of a container-based data center in accordance with the present disclosure is shown. In this embodiment, a significant percentage of the surface area of the side of container 400 (e.g., at least 90%) is used for vents. A large surface area permits improved air flow and cooling for computing devices in container 400, e.g., around 500 cfm, but other air flow rates are possible and contemplated.

Figure 6:
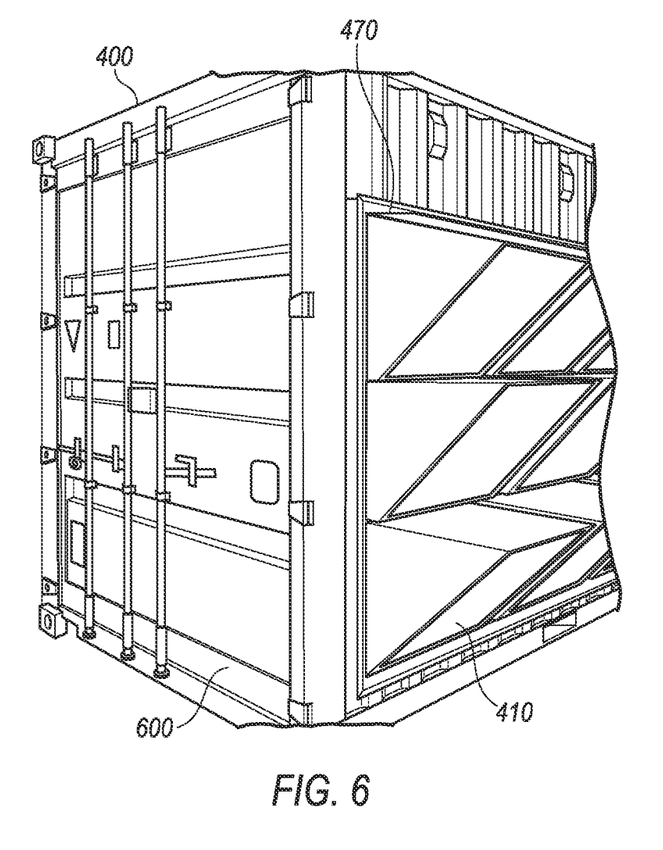
FIG. 6 is an end view of one example of a container-based data center.

Turning now to FIG. 6, an end view of one example of a container-based data center in accordance with the present disclosure is shown. In this embodiment, container 400 includes one or more doors 600 on one end of the container. Shipping containers often come with a double cargo door on one end of the container. This door opens in two sections allowing the entire interior end of the container to be accessed. In other embodiments, doors may be located on both of the short sides of container 400, or on one of the longer sides of container 400.

Vents 410 may be trapezoidal prisms in shape as shown, or triangular prisms, or other shapes (e.g., rectangular prisms). In this embodiment the top side 470 of the vents (e.g., on the top row of the array of vents) is extended longer to provide additional rain and snow rejection.

Figure 7:
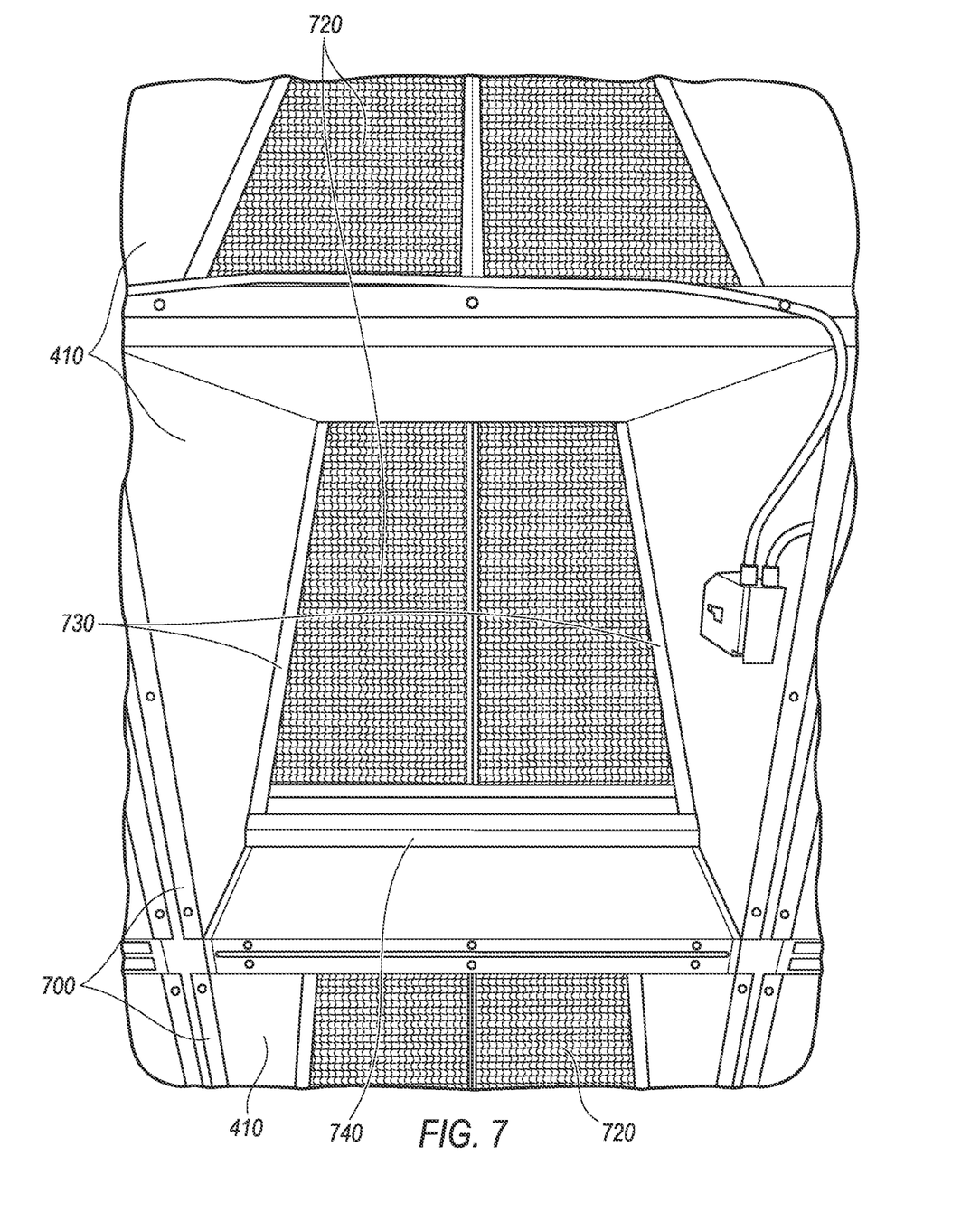
FIG. 7 is an interior view of one example of a container having air intake openings with vents.

Turning now to FIG. 7, an interior view of one example of a container having air intake openings 700 with vents 410 and filters 720 in accordance with the present disclosure is shown. As shown in the figure, the filters are not parallel with the opening and instead are positioned at an angle to the opening. This angle permits a greater surface area for the filter relative to the size of air intake openings 700. With an angle of 45 degrees as shown in the figure, the air filter is substantially larger than the corresponding air intake opening, beneficially permitting filtering with less airflow reduction. Channels 730 may be used to hold air filter 720 in place while permitting removal for cleaning. In one embodiment, air filter 720 may be washable metal filters, but other filter types are possible and contemplated. In some embodiments, air filter 720 may also be mist eliminators. Filters that are mist eliminators can remove not only dust but also moisture droplets from the air in order to protect the computing devices in the storage container. Mist eliminators work by utilizing composite mesh or vane plate surfaces to separate the mist droplets from gas streams through mechanical impingement and inertial impaction. The large surface area allows for the collection of liquids without substantially impeding the flow of gas.

In some embodiments, foggers can be used in connection with the containers 400 when ambient temperature is too high for efficient operation. Fogger systems typically comprise an inline filter, tubing, nozzles and high-pressure (e.g., 1000 psi) misting pump modules. Misting systems typically require high pressure in order to create 3-5 micron sized droplets that are desirable for cooling operation. The fog or mist is created by forcing water through a high-pressure pump module unit that is connected to specialized misting nozzles. This creates micro fine water particles that will subsequently evaporate. It also helps to filter the incoming water since even small particles can clog the tiny fog nozzle heads. The ambient temperature can beneficially be reduced up to 35 degrees when using an outdoor misting system in some environments (e.g., when humidity is low).

In some embodiments, a channel 740 may be connected to a bottom edge of the rectangular air filters 720 to catch moisture collected by the air filter, and the channel may then direct the collected moisture out of the container (e.g., via drain holes or tubes).

Figure 8:
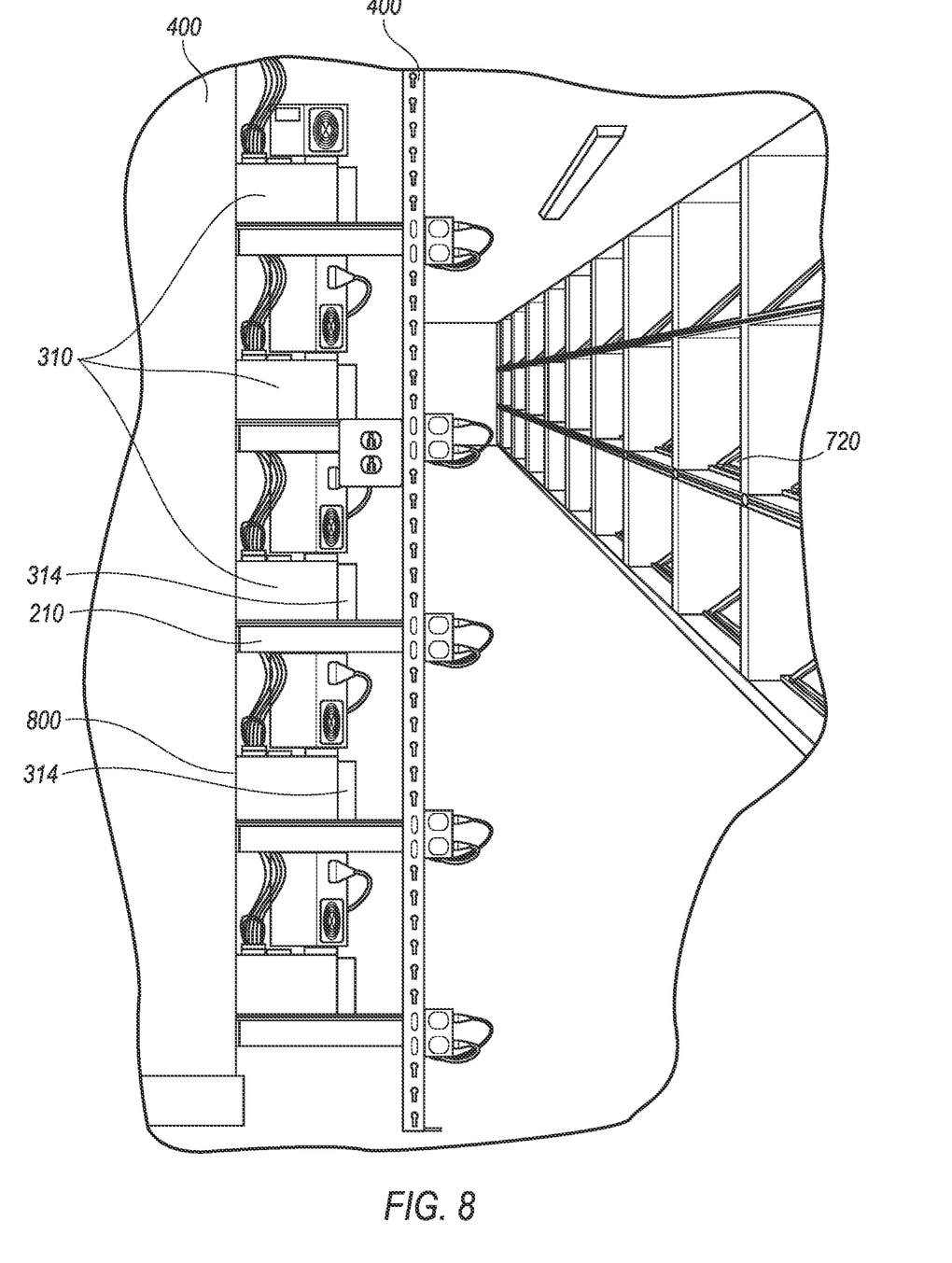
FIG. 8 is an interior view of one example of a container having racks for computing devices.

Turning now to FIG. 8, an interior view of one example of a container having racks for computing devices in accordance with the present disclosure is shown. Computing devices 310 are positioned on rack 210 such that fans 314 draw air in from outside container through vents 410 via filters 720. The exhaust of the computing device 310 is configured to directly feed the air heated by computing device 310 outside the container 400 via exhaust openings in the side of the container 800. These openings generally do not need air filters, as the volume of exiting air directs dust and debris away, so they can be left open. In other embodiments, exhaust vents of matching design to air intake vents 410 may be used. In place of a filter, a simple wire mesh with a square or hexagonal design (e.g., chicken wire) may be used on the exhaust openings or vents to keep falling debris out or for safety.

Reference throughout the specification to "various embodiments," "with embodiments," "in embodiments," or "an embodiment," or the like, means that a particular feature, structure, or characteristic described in connection with the embodiment is included in at least one embodiment. Thus, appearances of the phrases "in various embodiments," "with embodiments," "in embodiments," or "an embodiment," or the like, in places throughout the specification are not necessarily all referring to the same embodiment. Furthermore, the particular features, structures, or characteristics may be combined in any suitable manner in one or more embodiments. Thus, the particular features, structures, or characteristics illustrated or described in connection with one embodiment/example may be combined, in whole or in part, with the features, structures, functions, and/or characteristics of one or more other embodiments/examples without limitation given that such combination is not illogical or non-functional. Moreover, many modifications may be made to adapt a particular situation or material to the teachings of the present disclosure without departing from the scope thereof.

It should be understood that references to a single element are not necessarily so limited and may include one or more of such elements. Any directional references (e.g., plus, minus, upper, lower, upward, downward, left, right, leftward, rightward, top, bottom, above, below, vertical, horizontal, clockwise, and counterclockwise) are only used for identification purposes to aid the reader's understanding of the present disclosure, and do not create limitations, particularly as to the position, orientation, or use of embodiments.

Joinder references (e.g., attached, coupled, connected, and the like) are to be construed broadly and may include intermediate members between a connection of elements and relative movement between elements. As such, joinder references do not necessarily imply that two elements are directly connected/coupled and in fixed relation to each other. The use of "e.g." and "for example" in the specification is to be construed broadly and is used to provide non-limiting examples of embodiments of the disclosure, and the disclosure is not limited to such examples. Uses of "and" and "or" are to be construed broadly (e.g., to be treated as "and/or"). For example, and without limitation, uses of "and" do not necessarily require all elements or features listed, and uses of "or" are inclusive unless such a construction would be illogical.

While processes, systems, and methods may be described herein in connection with one or more steps in a particular sequence, it should be understood that such methods may be practiced with the steps in a different order, with certain steps performed simultaneously, with additional steps, and/or with certain described steps omitted.

All matter contained in the above description or shown in the accompanying drawings shall be interpreted as illustrative only and not limiting. Changes in detail or structure may be made without departing from the present disclosure.

It should be understood that a computer, a system, and/or a processor as described herein may include a conventional processing apparatus known in the art, which may be capable of executing preprogrammed instructions stored in an associated memory, all performing in accordance with the functionality described herein. To the extent that the methods described herein are embodied in software, the resulting software can be stored in an associated memory and can also constitute means for performing such methods. Such a system or processor may further be of the type having ROM, RAM, RAM and ROM, and/or a combination of non-volatile and volatile memory so that any software may be stored and yet allow storage and processing of dynamically produced data and/or signals.

It should be further understood that an article of manufacture in accordance with this disclosure may include a non-transitory computer-readable storage medium having a computer program encoded thereon for implementing logic and other functionality described herein. The computer program may include code to perform one or more of the methods disclosed herein. Such embodiments may be configured to execute via one or more processors, such as multiple processors that are integrated into a single system or are distributed over and connected together through a communications network, and the communications network may be wired and/or wireless. Code for implementing one or more of the features described in connection with one or more embodiments may, when executed by a processor, cause a plurality of transistors to change from a first state to a second state. A specific pattern of change (e.g., which transistors change state and which transistors do not), may be dictated, at least partially, by the logic and/or code.

What is claimed is:

1. A system for operating a container-based data center, the system comprising:
   a shipping container comprising two long sides each having one or more ventilation openings;
   an array of triangular prism air intake vents affixed to the outside of the shipping container on around the one or more ventilation openings on a first of the two long sides, wherein one rectangular side of each triangular prism vent comprises a rectangular air filter; and
   a plurality of racks for holding computing devices in close proximity to a second of the two long sides; and
   wherein the rectangular air filter is arranged at an angle to the one or more ventilation openings.

2. The system of claim 1, further comprising an array of triangular prism exhaust vents affixed to the second of the two long sides of the shipping container.

3. The system of claim 1, further comprising a channel connected to a bottom edge of the rectangular air filter, wherein the channel is configured to catch moisture collected by the rectangular air filter.

4. The system of claim 1, wherein the rectangular air filter is washable and comprises a metallic mesh with a metal frame and one or more drain holes.

5. The system of claim 4, wherein the rectangular air filter comprises a mist eliminator.

6. The system of claim 1, wherein each triangular prism vent comprises a pair of parallel channels configured to hold the rectangular air filter.

7. The system of claim 1, wherein the array of triangular prism air intake vents covers at least 90% of the first of the two long sides of the shipping container.

8. The system of claim 1, wherein the shipping container is a standard ISO steel intermodal container.

9. The system of claim 1, further comprising a plurality of computing devices, wherein each computing device comprises a cooling fan, wherein the plurality of computing devices are mounted on the plurality of racks and exhaust air through the ventilation openings in the second of the two long sides of the shipping container.

10. The system of claim 9, wherein airflow through the shipping container is approximately 500 cfm.

11. The system of claim 1, wherein the array of triangular prism air intake vents comprises rows, wherein the vents in a top row of the rows have a top that extends horizontally beyond an outer horizontal edge of a lower row of the rows of the array of triangular prism air intake vents.

12. The system of claim 1, wherein a combined surface area of the rectangular air filters is significantly larger than a surface area of the one or more ventilation openings on the first of the two long sides of the shipping container.

13. The system of claim 1, wherein the triangular prism air intake vents are isosceles right triangular prisms.

14. A system for operating a plurality of computing devices, the system comprising:
    a shipping container having two long sides and two short ends, wherein the shipping container comprises one or more openings on each of two long sides;
    an array of trapezoidal prism air intake vents affixed to the openings, wherein one rectangular side of each of the trapezoidal prism air intake vents comprises a rectangular air filter; and
    a plurality of racks for holding the plurality of computing devices in close proximity to a second of the two long sides; and
    wherein the array comprises a plurality of rows including a top row and at least one lower row, wherein each vent in the top row has a top that extends horizontally beyond an outer horizontal edge of the at least one lower row.

15. The system of claim 14, further comprising a channel connected to a bottom edge of at least one of the rectangular air filters, wherein the channel is configured to catch moisture collected by the at least one rectangular air filter.

16. The system of claim 14, wherein the array of trapezoidal prism air intake vents covers substantially all of a first long side of the two long sides of the shipping container.

17. The system of claim 14, further comprising a plurality of computing devices, wherein each computing device comprises a cooling fan, wherein each computing device is mounted on one of the plurality of racks and exhausts air through the openings in the second of the two largest sides of the shipping container.

18. The system of claim 14, wherein the rectangular air filter is arranged in a corresponding opening of the vents at an angle to the opening.

19. A system for operating a plurality of computing devices, the system comprising:
    a shipping container having a substantially rectangular prism shape and at least one air intake opening on at least a first side and at least one air exhaust opening on at least a second side, wherein the first side and the second side are on opposite sides of the shipping container;

an array of air intake vents affixed to an exterior of the shipping container by the at least one air intake opening, wherein at least one of the air intake vents comprises at least one air filter, wherein the at least one air filter is substantially larger than the corresponding air intake opening and is not parallel to the corresponding air intake opening; and a plurality of racks adjacent to the at least one air exhaust opening;

a plurality of computing devices positioned on the plurality of racks; and at least one fan operable to cool the plurality of computing devices by drawing fresh air in through the at least one air filter and to force air within the shipping container out the at least one air exhaust opening.

20. The system of claim 19, wherein the at least one air filter is arranged at an angle of degrees to the corresponding air intake opening.

* * * * *